United States Patent
Huang et al.

(10) Patent No.: US 9,769,962 B2
(45) Date of Patent: Sep. 19, 2017

(54) MOTOR CONTROLLER

(71) Applicant: Zhongshan Broad-Ocean Motor Co., Ltd., Zhongshan (CN)

(72) Inventors: Fengtai Huang, Zhongshan (CN); Bertrand Robert Mohr, Ann Arbor, MI (US)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 49 days.

(21) Appl. No.: 14/887,303

(22) Filed: Oct. 19, 2015

(65) Prior Publication Data
US 2016/0157391 A1 Jun. 2, 2016

(30) Foreign Application Priority Data
Nov. 29, 2014 (CN) .................... 2014 2 0739395 U (51) Int. Cl.
*H02P 1/00* (2006.01)
*H05K 7/20* (2006.01)

(52) U.S. Cl.
CPC ..... *H05K 7/20872* (2013.01); *H05K 7/20927* (2013.01)

(58) Field of Classification Search
CPC ....... H01L 2924/00; H01L 2224/48091; H01L 2924/1305; H01L 2924/13055; H01L 2924/00014; H01L 2924/0002; H01L 2924/13091; H01L 2224/48472; H01L 2224/49111; H01L 2224/48137; H01L 2924/19107

USPC .......... 318/139, 767, 782; 361/699; 248/637
See application file for complete search history.

(56) References Cited

U.S. PATENT DOCUMENTS

| | | | | |
|---|---|---|---|---|
| 6,621,701 B2* | 9/2003 | Tamba | ............... | H05K 7/20927 165/80.4 |
| 6,661,659 B2* | 12/2003 | Tamba | ............... | H05K 7/20927 165/80.4 |
| 7,579,805 B2* | 8/2009 | Saito | ................... | H05K 7/20927 318/767 |
| 7,641,490 B2* | 1/2010 | Korich | ................... | H02M 7/003 439/196 |
| 7,957,169 B2* | 6/2011 | Nakajima | ................ | B60K 6/26 361/677 |
| 7,965,510 B2* | 6/2011 | Suzuki | ................... | B60K 6/365 165/80.4 |
| 7,969,735 B2* | 6/2011 | Nakatsu | ................ | H02M 7/003 165/104.33 |
| 7,978,471 B2* | 7/2011 | Tokuyama | .............. | H01L 23/36 165/104.33 |

(Continued)

*Primary Examiner* — Paul Ip
(74) *Attorney, Agent, or Firm* — Matthias Scholl, PC; Matthias Scholl (57) ABSTRACT

A motor controller, including: a box body, a capacitor module, and an inverse module. The box body includes a chamber, and a radiator is disposed in the chamber. The radiator divides the chamber to yield a first chamber and a second chamber. The inverse module is disposed on an upper surface of the radiator in the first chamber. The capacitor module is disposed on a lower surface of the radiator in the second chamber. The radiator includes a cooling waterway, and a water inlet and a water outlet that communicate with the cooling waterway. The cooling waterway is adapted to cool the capacitor module and the inverse module.

22 Claims, 7 Drawing Sheets

(56) References Cited

U.S. PATENT DOCUMENTS

| | | | | |
|---|---|---|---|---|
| 8,072,760 B2* | 12/2011 | Matsuo | H01L 23/473 | 165/104.33 |
| 8,159,849 B2* | 4/2012 | Nakajima | B60K 6/26 | 361/707 |
| 8,212,382 B2* | 7/2012 | Nakatsu | H05K 7/20927 | 307/9.1 |
| 8,228,700 B2* | 7/2012 | Yahata | H02M 7/003 | 361/601 |
| 8,240,411 B2* | 8/2012 | Nakatsu | B60L 11/00 | 180/65.21 |
| 8,373,300 B2* | 2/2013 | Nakatsu | H05K 7/20927 | 307/9.1 |
| 8,376,069 B2* | 2/2013 | Nakatsu | B60L 11/00 | 180/65.21 |
| 8,416,574 B2* | 4/2013 | Tokuyama | H01L 23/36 | 165/104.33 |
| 8,462,531 B2* | 6/2013 | Nishikimi | H05K 7/20927 | 361/679.46 |
| 8,587,977 B2* | 11/2013 | Nishikimi | H05K 7/20927 | 361/679.46 |
| 8,674,636 B2* | 3/2014 | Matsuo | B60K 6/445 | 318/400.01 |
| 8,693,193 B2* | 4/2014 | Ishibashi | H02M 7/003 | 361/688 |
| 8,699,254 B2* | 4/2014 | Nishikimi | H05K 7/20927 | 361/271 |
| 8,863,869 B2* | 10/2014 | Nakatsu | B60L 11/00 | 180/65.21 |
| 8,902,623 B2* | 12/2014 | Nishikimi | H05K 7/20927 | 361/709 |
| 2003/0067748 A1* | 4/2003 | Tamba | H05K 7/20927 | 361/699 |
| 2003/0067749 A1* | 4/2003 | Tamba | H05K 7/20927 | 361/699 |
| 2007/0246635 A1* | 10/2007 | Nakajima | B60K 6/26 | 248/637 |
| 2007/0246636 A1* | 10/2007 | Katayama | B60L 11/12 | 248/637 |
| 2007/0253164 A1* | 11/2007 | Matsuo | H01L 23/473 | 361/699 |
| 2008/0049476 A1* | 2/2008 | Azuma | B60L 3/12 | 363/131 |
| 2008/0130223 A1* | 6/2008 | Nakamura | H02M 7/003 | 361/689 |
| 2009/0040724 A1* | 2/2009 | Nishikimi | H05K 7/20927 | 361/699 |
| 2009/0231811 A1* | 9/2009 | Tokuyama | H01L 23/36 | 361/699 |
| 2010/0025126 A1* | 2/2010 | Nakatsu | B60L 11/00 | 180/65.1 |
| 2010/0026090 A1* | 2/2010 | Nakatsu | H05K 7/20927 | 307/9.1 |
| 2010/0097765 A1* | 4/2010 | Suzuki | B60K 6/365 | 361/699 |
| 2010/0157640 A1* | 6/2010 | Azuma | B60L 3/12 | 363/132 |
| 2010/0188813 A1* | 7/2010 | Nakatsu | H02M 7/003 | 361/689 |
| 2010/0208427 A1* | 8/2010 | Horiuchi | H05K 7/20927 | 361/699 |
| 2011/0032676 A1* | 2/2011 | Matsuo | H01L 23/473 | 361/703 |
| 2011/0069466 A1* | 3/2011 | Herron | H02M 7/003 | 361/803 |
| 2011/0199800 A1* | 8/2011 | Yahata | H02M 7/003 | 363/131 |
| 2011/0235270 A1* | 9/2011 | Nakatsu | H02M 7/003 | 361/689 |
| 2011/0249421 A1* | 10/2011 | Matsuo | B60L 7/14 | 361/821 |
| 2012/0008286 A1* | 1/2012 | Suzuki | B60L 11/14 | 361/730 |
| 2012/0039039 A1* | 2/2012 | Nishikimi | H05K 7/20927 | 361/689 |
| 2012/0170217 A1* | 7/2012 | Nishikimi | H05K 7/20927 | 361/689 |
| 2012/0188712 A1* | 7/2012 | Ishibashi | H02M 7/003 | 361/688 |
| 2013/0044434 A1* | 2/2013 | Sharaf | H05K 7/20927 | 361/702 |
| 2013/0128645 A1* | 5/2013 | Nakatsu | B60L 11/00 | 363/141 |
| 2013/0194853 A1* | 8/2013 | Tokuyama | H01L 23/36 | 363/131 |
| 2014/0016387 A1* | 1/2014 | Nishikimi | H05K 7/20927 | 363/132 |
| 2014/0133199 A1* | 5/2014 | Matsuo | B60L 7/14 | 363/40 |
| 2015/0055386 A1* | 2/2015 | Nishikimi | H05K 7/20927 | 363/132 |

* cited by examiner

MOTOR CONTROLLER

CROSS-REFERENCE TO RELATED APPLICATIONS

Pursuant to 35 U.S.C. §119 and the Paris Convention Treaty, this application claims the foreign priority benefit of Chinese Patent Application No. 201420739395.2 filed Nov. 29, 2014, the contents of which, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to a motor controller.

Description of the Related Art

Typical motor controllers of electric vehicles have the following disadvantages:

1. The volume of the motor controllers is large, thus occupying much installation space of electric vehicles;
2. The inverter module and capacitor module are assembled dispersedly, thus reducing the heat dissipation efficiency thereof;
3. Existing motor controllers fail to cool the laminated busbar and the AC copper bar; and
4. Existing motor controllers include bunched wires, thereby causing complex connection and high cost.

SUMMARY OF THE INVENTION

In view of the above-described problems, it is one objective of the invention to provide a motor controller which features a simple and compact structure, can effectively cool an inverter module and a capacitor module via the radiator. In addition, the motor controller has a smaller volume, leading to a lower cost and a more simple and convenient connection between each parts.

To achieve the above objective, in accordance with one embodiment of the invention, there is provided a motor controller, comprising: a box body, a capacitor module, and an inverter module. The box body comprises a chamber, and a radiator is disposed in the chamber. The radiator divides the chamber to yield a first chamber and a second chamber. In the first chamber, an inverter module is disposed on an upper surface of the radiator. In the second chamber, a capacitor module is disposed on a lower surface of the radiator. The radiator comprises a cooling waterway, a water inlet and a water outlet that communicate with the cooling waterway, and the cooling waterway is adapted to cool the capacitor module and the inverter module.

In a class of this embodiment, the inverter module comprises an insulated gate bipolar transistor (IGBT) module, a drive circuit board, and a control circuit board. The drive circuit board and the control circuit board are disposed on an upper surface of the IGBT module in sequence. A needle bed stretches downwards from a bottom of the IGBT module. The upper surface of the radiator is provided with the inverter module and grooves, and the needle bed on the IGBT module stretches into the grooves on the upper surface of the radiator.

In a class of this embodiment, the inverter module outputs a three-phase alternating current via a group of the AC copper bar which is clung to a bottom wall of the first chamber. A passageway is disposed on the radiator beneath the AC copper bar. The passageway is connected to the grooves to form the cooling waterway. The grooves communicate with the water inlet, and the passageway communicates with the water outlet.

In a class of this embodiment, an external direct current power is input into the inverter module via the laminated busbar. The inverter module is clung to the capacitor module via a direct current copper bar. The bottom wall of the first chamber is provided with support platforms, and the laminated busbar is clung to an upper surface of the support platforms.

In a class of this embodiment, a first terminal box is disposed on a lateral surface at a bottom of the box body. Three-phase AC output terminals are disposed on the first terminal box. A sensor circuit board is disposed on the bottom wall of the first chamber, and is connected to the control circuit board. The sensor circuit board is provided with three current sensors, and a first terminal is disposed in a middle of each current sensor. One end of the first terminal is connected to the AC copper bar, and another end of the first terminal passes through the current sensor and the bottom wall of the first chamber, and stretches into the first terminal box to electrically connect to one of the three-phase AC output terminals.

In a class of this embodiment, a second terminal box is disposed on a lateral surface at a bottom of the box body, and a direct current input terminal is disposed on the second terminal box. Two second terminals are disposed inside the first chamber. One end of the second terminal is connected to the laminated busbar, and another end of the second terminal passes through the bottom wall of the first chamber, and stretches into the second terminal box to electrically connect to one of the direct current input terminal.

In a class of this embodiment, the support platforms are two in number. The two support platforms are positioned at two sides of the bottom wall of the first chamber, separately. A resistance capacitance snubber circuit board is disposed between the two support platforms, and is electrically connected to the laminated busbar.

In a class of this embodiment, a common mode filter is sleeved on the second terminal, and the second terminal passes through the common mode filter.

In a class of this embodiment, the box body is provided with a low-voltage signal connector which is electrically connected to the control circuit board.

In a class of this embodiment, the control circuit board is electrically connected to the drive circuit board via board to board connectors. The sensor circuit board is electrically connected to the control circuit board via the bunched wires.

In a class of this embodiment, a water supply connector and a water outlet connector are disposed on a side of the box body. The water supply connector is connected to the water inlet of the cooing waterway, and the water outlet connector is connected to the water outlet of the cooling waterway.

Compared with existing technologies, advantages of the motor controller according to embodiments of the invention are given below:

1. The inverter module is disposed inside the first chamber on the upper surface of the radiator, and the capacitor module is disposed inside the second chamber on the bottom of the radiator. The radiator comprises a cooling waterway and a water inlet and a water outlet that communicate with the cooling waterway, and the cooling waterway is adapted to cool the capacitor module and the inverter module. The motor controller features a simple and compact structure, is convenient to assemble, and can effectively cool an inverter module and a capacitor module via the radiator. In addition, the motor controller has a smaller volume, leading to a lower cost and a more simple and convenient connection between each parts.

2. A needle bed stretches downwards from a bottom of the IGBT module. The upper surface of the radiator is provided with the inverter module and grooves, and the needle bed on the IGBT module stretches into the grooves on the upper surface of the radiator. The IGBT module features a simple structure. The heat produced by the inverter module when working transfers to the needle bed of the IGBT module, then the cooling water passing through the grooves takes the heat on the needle bed away. The cooling method is more direct, efficient, and effective.

3. The AC copper bar is clung to a bottom wall of the first chamber. A passageway is disposed on the radiator beneath the AC copper bar. The heat produced by the AC copper bar when working transfers to the bottom wall of the first chamber, then the cooling water passing through the passageway takes the heat on the bottom wall of the first chamber away, so as to effectively cool the exchange cooper bar and guarantee a stable and reliable work of the motor controller.

4. The bottom wall of the first chamber is provided with support platforms, and the laminated busbar is clung to an upper surface of the support platforms. The heat produced by the laminated busbar when working is transferred to the support platform and releases via a box body, so as to cool the laminated busbar and guarantee a stable and reliable work of the motor controller.

5. A resistance capacitance snubber circuit board is disposed between the two support platforms, and is electrically connected to the laminated busbar. The resistance capacitance snubber circuit can filter the direct current power input by the laminated busbar, and improve the electromagnetic compatibility thereof.

6. A common mode filter is sleeved on the second terminal. When the motor controller failed the electromagnetic compatibility test or under other conditions, the electromagnetic compatibility of the motor controller can be improved by adding the common mode filter, and the common mode interference can be decreased.

7. The box body is provided with a low-voltage signal connector which is electrically connected to the control circuit board, facilitating a compact structure and a high reliability.

DETAILED DESCRIPTION OF THE EMBODIMENTS

For further illustrating the invention, experiments detailing a motor controller are described below. It should be noted that the following examples are intended to describe and not to limit the invention.

Figure 1:
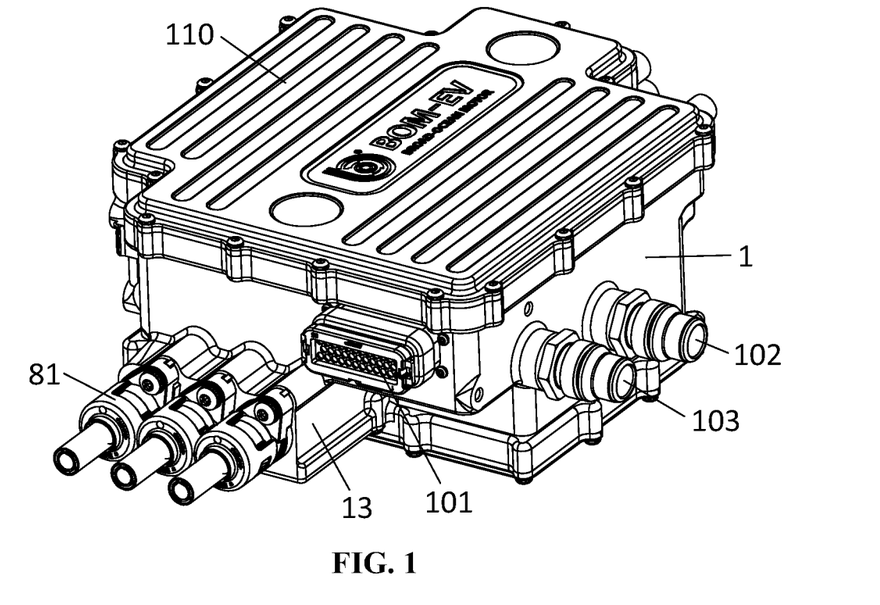
FIG. 1 is a stereogram of a motor controller from a first angle in accordance with one embodiment of the invention.
Figure 2:
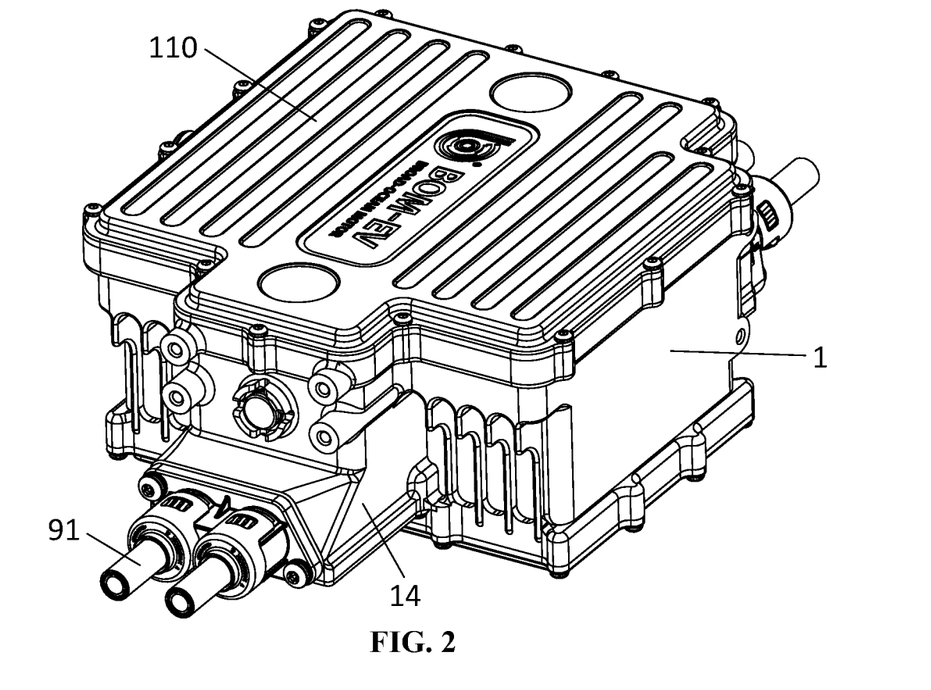
FIG. 2 is a stereogram of a motor controller from a second angle in accordance with one embodiment of the invention.
Figure 3:
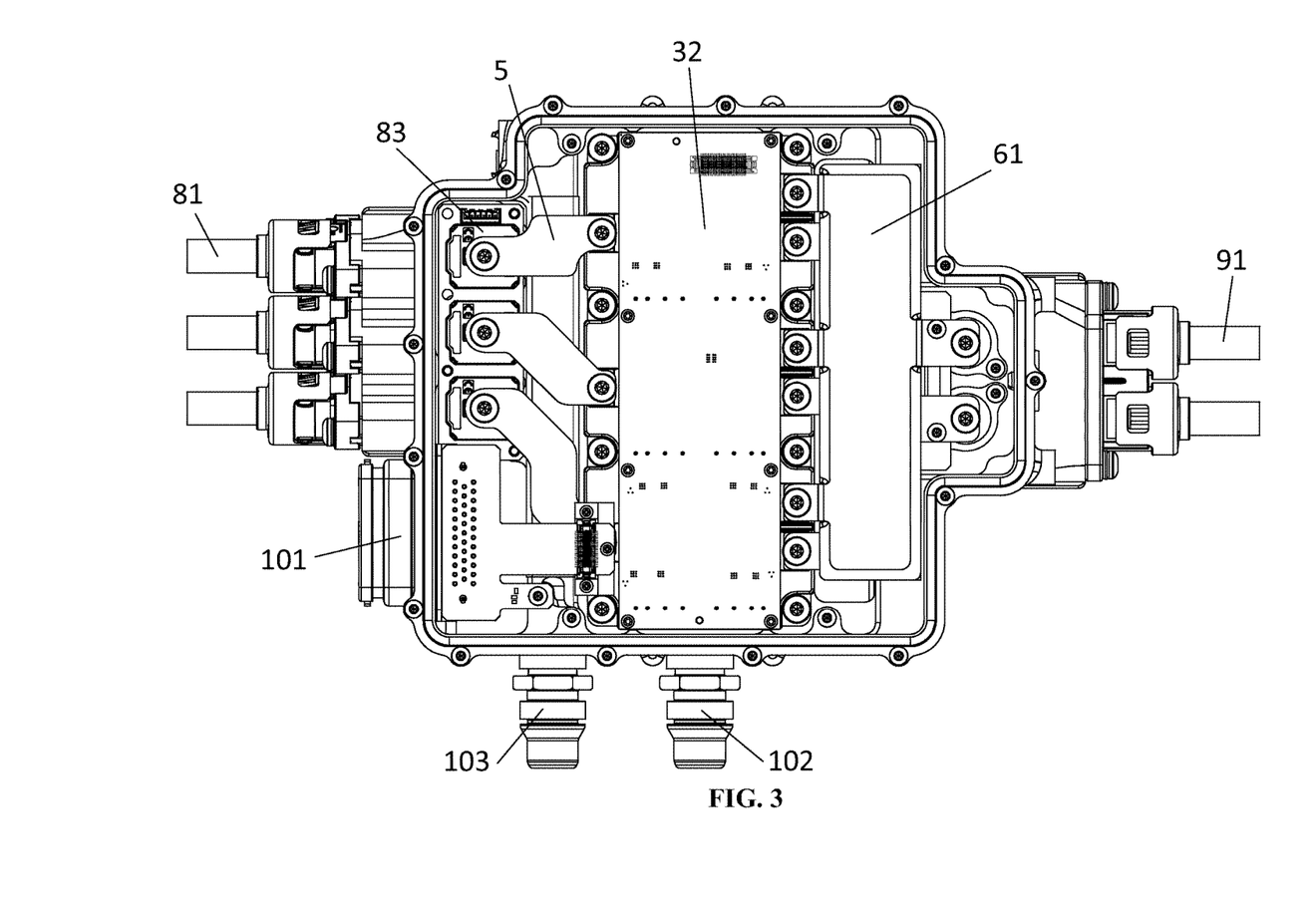
FIG. 3 is a top view of a motor controller in the absence of a box cover in accordance with one embodiment of the invention.
Figure 4:
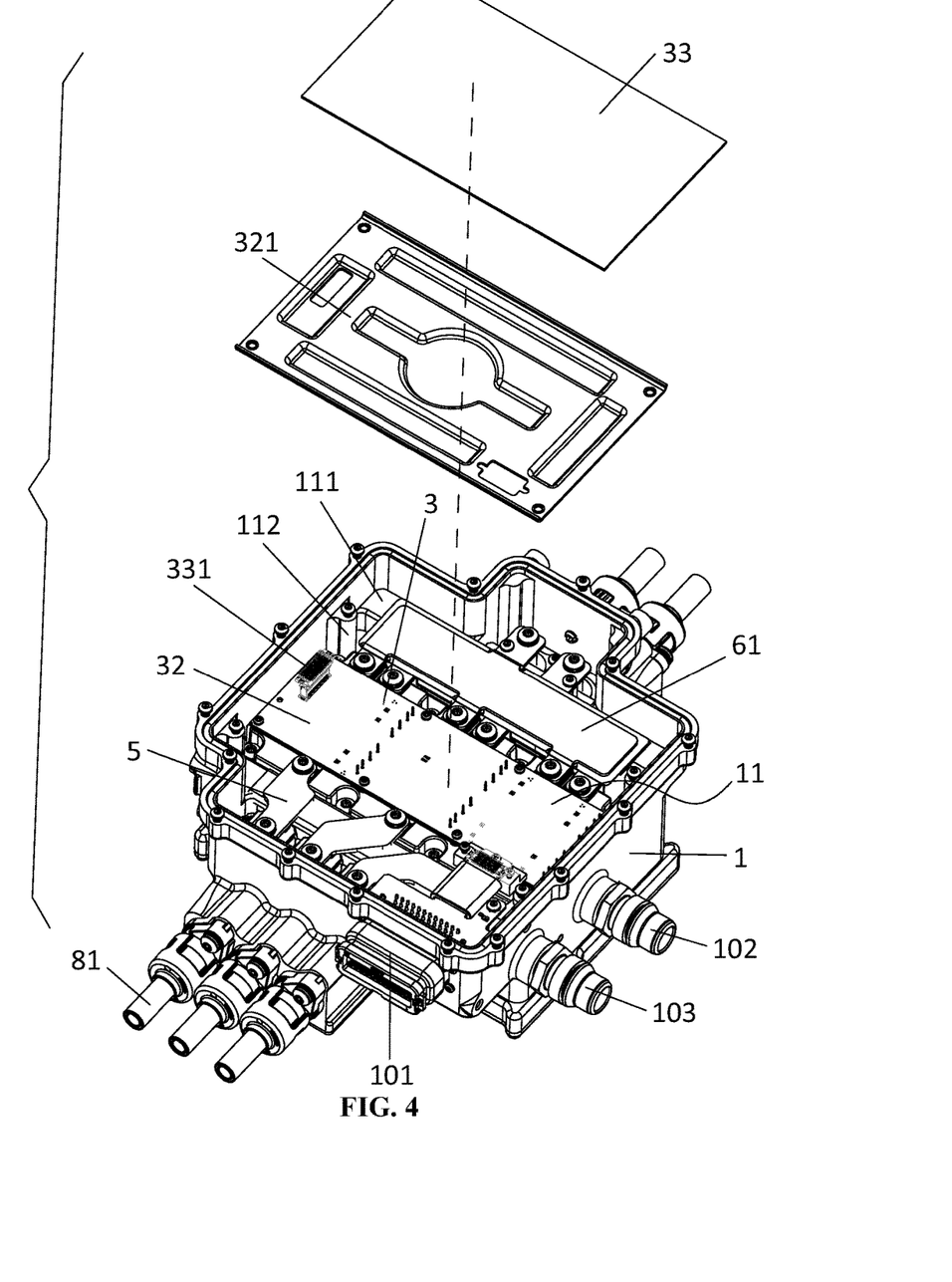
FIG. 4 is an exploded top view of a motor controller in accordance with one embodiment of the invention.
Figure 5:
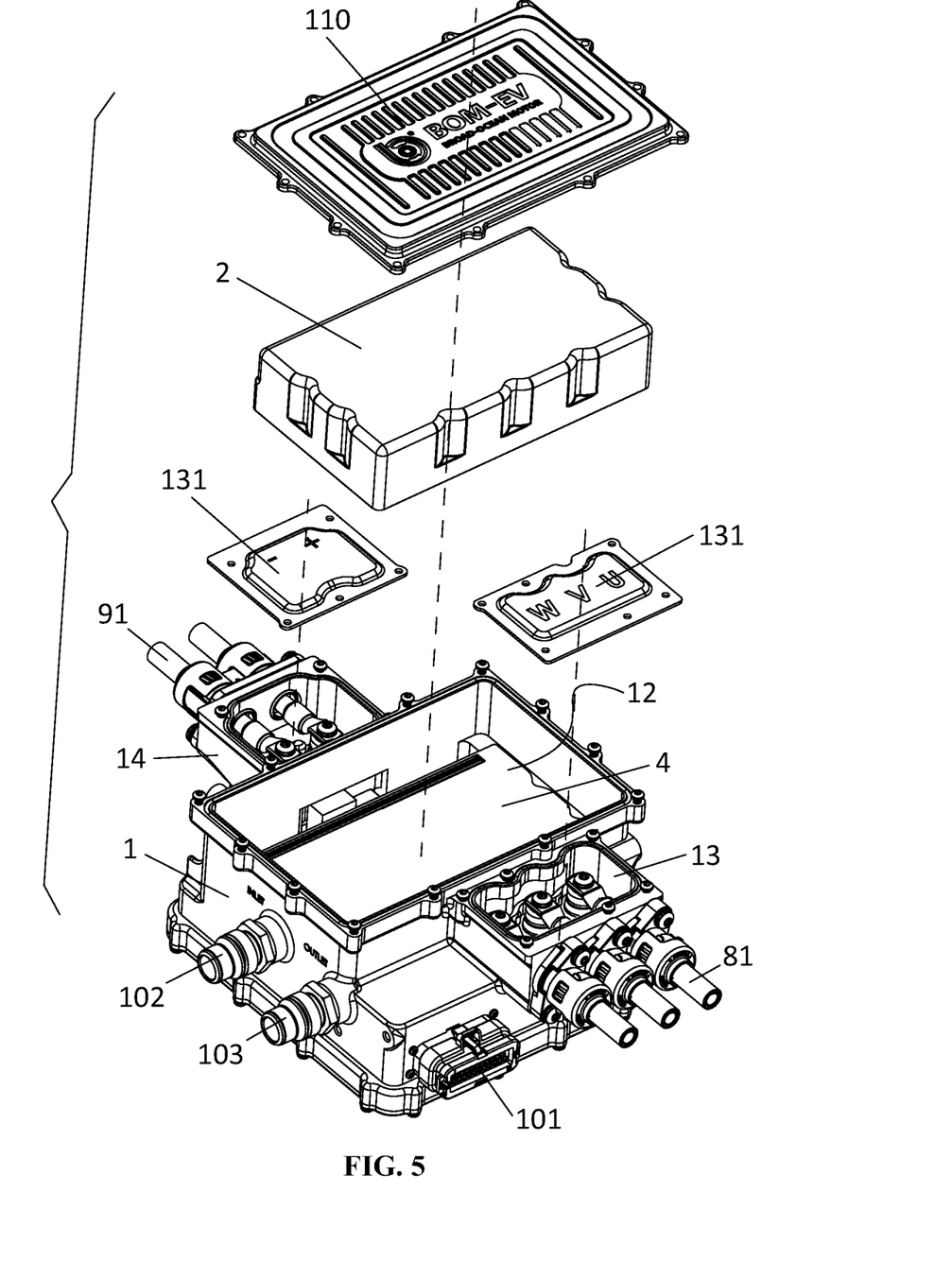
FIG. 5 is an exploded bottom view of a motor controller in accordance with one embodiment of the invention.
Figure 6:
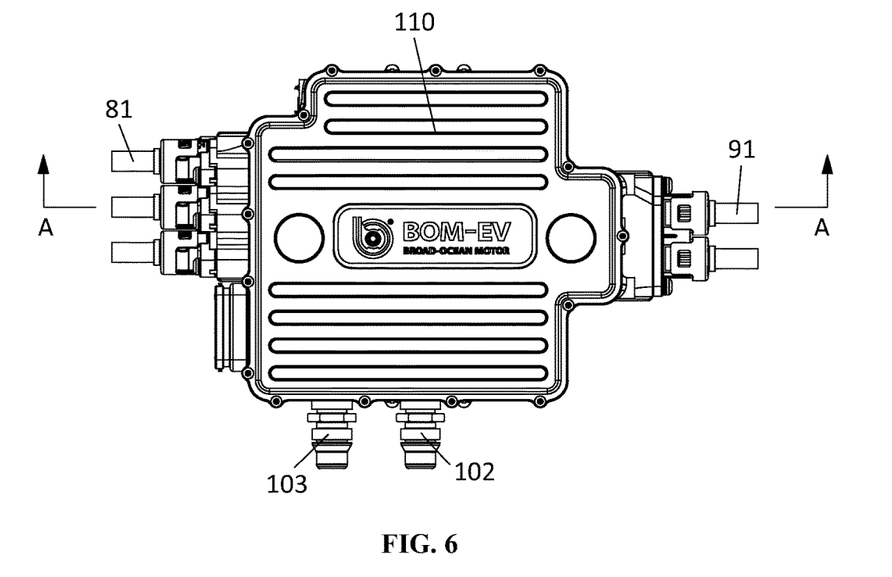
FIG. 6 is a top view of a motor controller in accordance with one embodiment of the invention.
Figure 7:
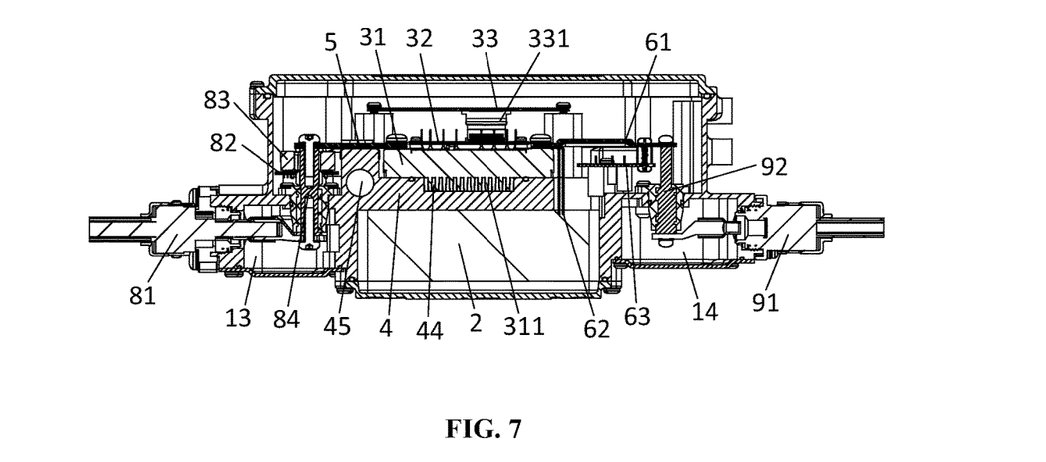
FIG. 7 is an exploded view taken from line A-A in FIG. 6.
Figure 8:
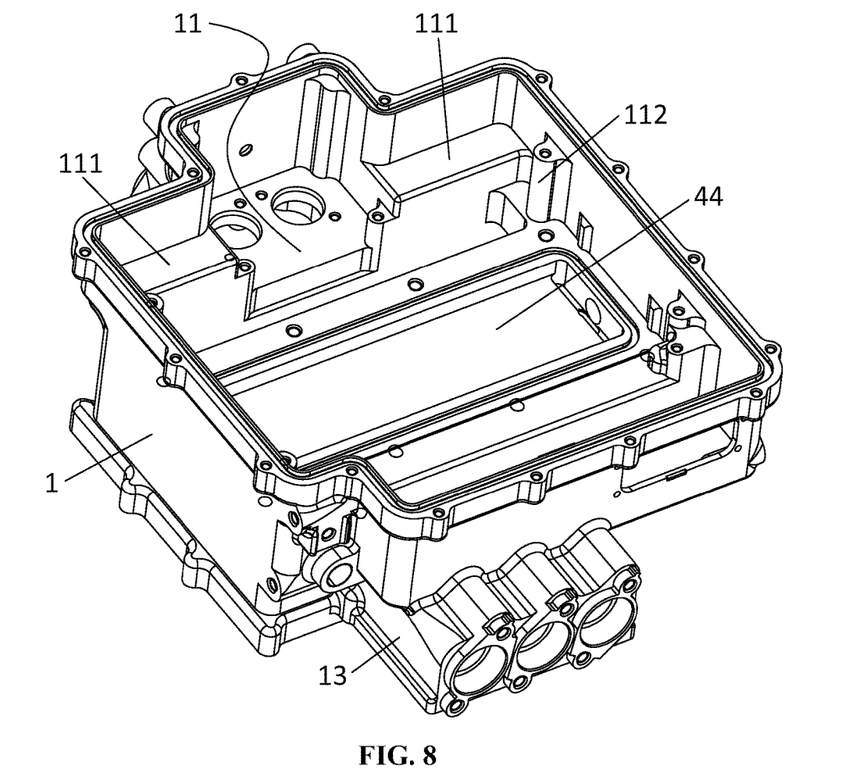
FIG. 8 is a stereogram of a box body in accordance with one embodiment of the invention.
Figure 9:
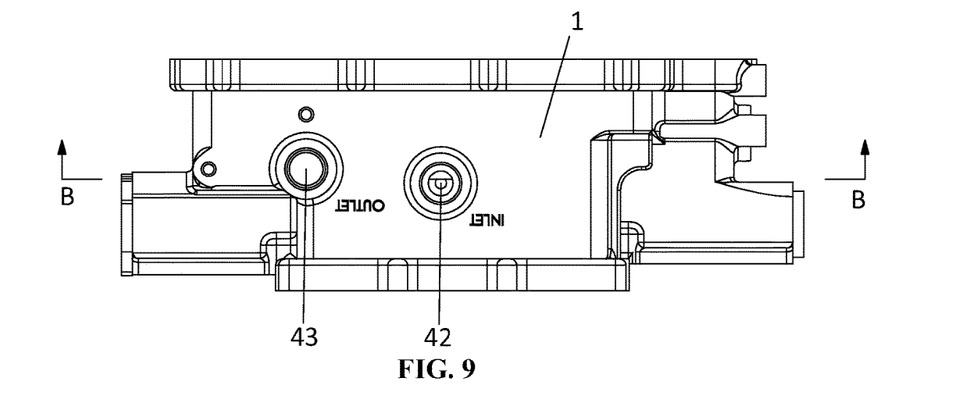
FIG. 9 is a side view of a box body in accordance with one embodiment of the invention.
Figure 10:
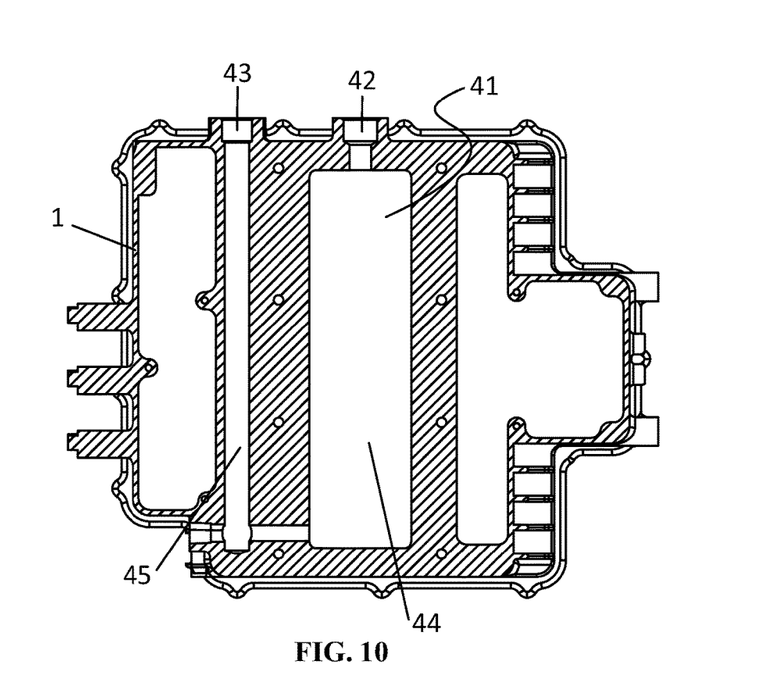
FIG. 10 is an exploded view of B-B in FIG. 9.
Figure 11:
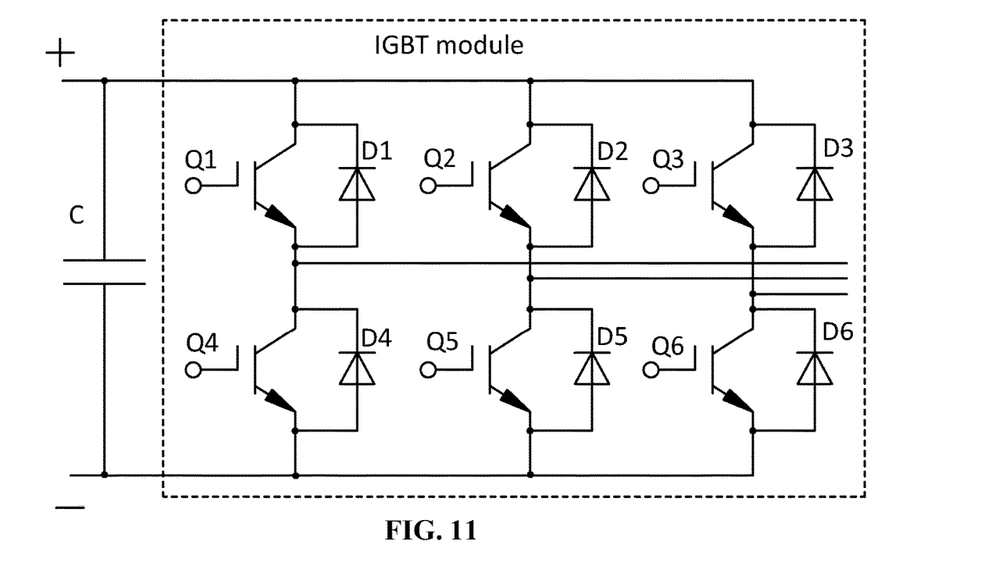
FIG. 11 is a circuit diagram of a motor controller in accordance with one embodiment of the invention.

As shown in FIGS. 1-11, a motor controller comprises: a box body 1, a capacitor module 2, and an inverter module 3. The box body 1 is provided with a chamber inside, and a radiator 4 is disposed in the chamber. The radiator 4 divides the chamber to yield a first chamber 11 and a second chamber 12. Inside the first chamber 11, an inverter module 3 is disposed on an upper surface of the radiator 4. Inside the second chamber 12, a capacitor module 2 is disposed on a lower surface of the radiator 4. The radiator 4 comprises a cooling waterway 41, a water inlet 42 and a water outlet 43 that communicate with the cooling waterway 41, and the cooling waterway 41 is adapted to cool the capacitor module 2 and the inverter module 3. Tops 110 are assembled on the top and the bottom of the box body 1 to seal the first chamber 11 and the second chamber 12.

The inverter module 3 comprises an insulated gate bipolar transistor (IGBT) module 31, a drive circuit board 32, and a control circuit board 33. The drive circuit board 32 and the control circuit board 33 are disposed on an upper surface of the IGBT module 31 in sequence. A plurality of support pillars 112 is disposed on a side wall of the first chamber 11. The control circuit board 33 is supported and assembled on the top of the support pillars 112. A shielding plate 321 is disposed on the bottom of the control circuit board 33, thus the shielding plate 321 can shield the control circuit board 33 from electromagnetic interfering signals produced by the IGBT module 31 and the drive circuit board 32 beneath the control circuit board 33. The IGBT module 31 employs a six-in-one IGBT module. The capacitor module 2 is connected to a direct current bus (parallel connected to two ends of the direct current bus), and provides ripple current for the inverter module 3. A needle bed 311 stretches downwards from a bottom of the IGBT module 31. The upper surface of the radiator 4 is provided with grooves 44, around the grooves 44 and on the upper surface of the radiator 4 is provided with a circular groove, and a seal ring is disposed inside the circular groove. The inverter module 3 is disposed on the upper surface of the radiator 4 and compresses the seal ring inside the circular groove. The needle bed 311 on the IGBT module 31 stretches into the grooves 44 on the upper surface of the radiator 4. The heat produced by the inverter module 3 when working transfers to the needle bed 311 of the IGBT module 31, then the cooling water passing through the grooves 44 takes the heat on the needle bed 311 away, thus the inverter module 3 is cooled. The cooling method is more direct, efficient and effective. The capacitor module 2 is clung to the bottom of the radiator 4. The heat produced by the capacitor module 2 when working transfers to the radiator 4, then the cooling water passing through the grooves of the radiator 4 take the heat on the radiator 4 away, thus the capacitor module 2 is cooled.

The inverter module 3 outputs a three-phase alternating current via a group of the AC copper bar 5 which is clung to a bottom wall of the first chamber 11. An insulation paper is positioned between a lower surface of the AC copper bar 5 and the bottom wall of the first chamber 11. The insulation paper is employed to insulate and transfer heat. A passageway 45 is disposed on the radiator 4 beneath the AC copper bar 5. The passageway 45 is connects to the grooves 44 to form the cooling waterway 41. The grooves 44 communicate with the water inlet 42, and the passageway 45 is connected to the water outlet 43. The heat produced by the AC copper bar 5 when working transfers to the bottom wall of the first chamber 11, then the cooling water passing through the passageway 45 takes the heat on the bottom wall of the first chamber 11 away, so as to effectively cool the exchange cooper bar 5 and guarantee a stable and reliable work of the motor controller.

An external direct current power is input into the inverter module 3 via the laminated busbar 61. The inverter module 3 is electrically connected to the capacitor module 2 via the AC copper bar 62. The two support platforms 111 are positioned at two sides of the bottom wall of the first chamber 11, separately. The laminated busbar 61 is clung to the upper surface of the support platform 111. An insulation paper is positioned between a lower surface of the laminated busbar 61 and the upper surface of the support platform 111. The insulation paper is employed to insulate and transfer heat. The heat produced by the laminated busbar 61 when working is transferred to the support platform 111 and releases via a box body 1, so as to cool the laminated busbar 61 and guarantee a stable and reliable work of the motor controller. The support platforms 111 are two in number. The two support platforms 111 are positioned at two sides of the bottom wall of the first chamber 11, separately. A resistance capacitance snubber circuit board 63 is disposed between the two support platforms 111, and is electrically connected to the laminated busbar 61. The resistance capacitance snubber circuit board 63 can filter the direct current power input by the laminated busbar 61, and improve the electromagnetic compatibility thereof.

A first terminal box 13 is disposed on a front facet at a bottom of the box body 1. Three-phase AC output terminals 81 are disposed on the first terminal box 13, and the first terminal box 13 is provided with a box cover 131 to seal the first terminal box 13. A sensor circuit board 82 is disposed on the bottom wall of the first chamber 11, and is electrically connected to the control circuit board 33 via bunched wires. The sensor circuit board 82 is provided with three current sensors 83, and a first terminal 84 is disposed in a middle of each current sensor 83. One end of the first terminal 84 is electrically connected to the AC copper bar 5, and another end of the first terminal 84 passes through the current sensor 83 and the bottom wall of the first chamber 11, and stretches into the first terminal box 13 to electrically connect to one of the three-phase AC output terminals 81. The inverter module 3 outputs three-phase alternating current via the AC copper bar 5, the first terminal 84, and the three-phase AC output terminal 81.

A second terminal box 14 is disposed on a rear facet at a bottom of the box body 1, and a direct current input terminal 91 is disposed on the second terminal box 14, and the second terminal box 14 is provided with the box cover 131 to seal the second terminal box 14. Two second terminals 92 are disposed inside the first chamber 11. One end of the second terminal 92 is connected to the laminated busbar 61, and another end of the second terminal 92 passes through the bottom wall of the first chamber 11, and stretches into the second terminal box 14 to electrically connect to the direct current input terminal 91. The external direct current power is input into the inverter module 3 via the direct current input terminal 91, the second terminal 92, and the laminated busbar 61.

A common mode filter (not shown) is sleeved on the second terminal 92, and the second terminal 92 passes through the common mode filter. When the motor controller failed the electromagnetic compatibility test or under other conditions, the electromagnetic compatibility of the motor controller can be improved by adding the common mode filter, and the common mode interference can be decreased.

The front facet of the box body 1 is provided with a low-voltage signal connector 101 which is electrically connected to the control circuit board 33. The control circuit board 33 is electrically connected to the drive circuit board 32 via board to board connectors 331. Only a few bunched wires are employed in the whole motor controller connections to connect the sensor circuit board 82 and the control circuit board 33, and other parts of the motor controller are connected without any wire harness, facilitating a simple structure and a more convenient and reliable connection.

A water supply connector 102 and a water outlet connector 103 are disposed on a side of the box body 1. The water supply connector 102 is connected to the water inlet 42 of the cooing waterway 41, and the water outlet connector 103 is connected to the water outlet 43 of the cooling waterway 41. The cooling water runs from the water supply connecter 102 into the grooves 44, then passes through the passageway 45 and runs out from the water outlet connector 103, so as to effectively cool the capacitor 2, the inverter module 3, and the AC copper bar 5.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A motor controller, comprising:
   a) a box body comprising a chamber;
   b) a capacitor module;
   c) an inverter module; and
   d) a radiator comprising an upper surface, a lower surface, a cooling waterway, a water inlet, and a water outlet;
   wherein:
   the radiator is disposed in the chamber and divides the chamber to yield a first chamber and a second chamber;
   the inverter module is disposed on the upper surface of the radiator and in the first chamber;
   the capacitor module is disposed on the lower surface of the radiator and in the second chamber;
   the water inlet and the water outlet communicate with the cooling waterway; and
   the cooling waterway is in contact with the capacitor module and the inverter module and is adapted to cool the capacitor module and the inverter module.

2. The motor controller of claim 1, wherein the inverter module comprises an insulated gate bipolar transistor (IGBT) module, a drive circuit board, and a control circuit board; the drive circuit board and the control circuit board are disposed on an upper surface of the IGBT module in sequence; a needle bed stretches downwards from a bottom of the IGBT module; the upper surface of the radiator is provided with grooves, and the needle bed on the IGBT module stretches into the grooves on the upper surface of the radiator.

3. The motor controller of claim 2, wherein the inverter module outputs a three-phase alternating current via a group of AC copper bars which is clung to a bottom wall of the first chamber; a passageway is disposed on the radiator beneath the group of AC copper bars; the passageway is connected to the grooves to form the cooling waterway; the grooves communicate with the water inlet, and the passageway communicates with the water outlet.

4. The motor controller of claim 2, wherein the box body is provided with a low-voltage signal connector which is electrically connected to the control circuit board.

5. The motor controller of claim 4, wherein a water supply connector and a water outlet connector are disposed on a side of the box body; the water supply connector is connected to the water inlet of the cooing waterway, and the water outlet connector is connected to the water outlet of the cooling waterway.

6. The motor controller of claim 1, wherein an external direct current power is input into the inverter module via a laminated busbar; the inverter module is electrically connected to the capacitor module via a direct current copper bar; a bottom wall of the first chamber is provided with support platforms, and the laminated busbar is clung to an upper surface of the support platforms.

7. The motor controller of claim 6, wherein the support platforms are two in number; the two support platforms are positioned at two sides of the bottom wall of the first chamber, separately; a resistance capacitance snubber circuit board is disposed between the two support platforms, and is electrically connected to the laminated busbar.

8. The motor controller of claim 6, wherein the box body is provided with a low-voltage signal connector which is electrically connected to the control circuit board.

9. The motor controller of claim 8, wherein a water supply connector and a water outlet connector are disposed on a side of the box body; the water supply connector is connected to the water inlet of the cooing waterway, and the water outlet connector is connected to the water outlet of the cooling waterway.

10. A motor controller, comprising:
a) a box body comprising a chamber;
b) a capacitor module;
c) an inverter module; and
d) a radiator comprising an upper surface, a lower surface, a cooling waterway, a water inlet, and a water outlet;
wherein:
the radiator is disposed in the chamber and divides the chamber to yield a first chamber and a second chamber;
the inverter module is disposed on the upper surface of the radiator and in the first chamber;
the capacitor module is disposed on the lower surface of the radiator and in the second chamber;
the water inlet and the water outlet communicate with the cooling waterway;
the cooling waterway is adapted to cool the capacitor module and the inverter module;
the inverter module is electrically connected to the capacitor module via a direct current copper bar;
an external direct current power is input into the inverter module via a laminated busbar;
a bottom wall of the first chamber is provided with support platforms, and the laminated busbar is clung to an upper surface of the support platforms;
a first terminal box is disposed on a lateral surface of a bottom of the box body;
three-phase AC output terminals are disposed on the first terminal box;
a sensor circuit board is disposed on the bottom wall of the first chamber, and is electrically connected to a control circuit board;
the sensor circuit board is provided with three current sensors, and a first terminal is disposed in a middle of each current sensor; and
one end of the first terminal is connected to an AC copper bar, and another end of the first terminal passes through the current sensor and the bottom wall of the first chamber, and stretches into the first terminal box to electrically connect to one of the three-phase AC output terminals.

11. The motor controller of claim 10, wherein a second terminal box is disposed on the lateral surface of the bottom of the box body and a direct current input terminal is disposed on the second terminal box; two second terminals are disposed inside the first chamber; one end of the second terminals is connected to the laminated busbar, and another end of the second terminals passes through the bottom wall of the first chamber, and stretches into the second terminal box to electrically connect to the direct current input terminal.

12. The motor controller of claim 11, wherein the support platforms are two in number; the two support platforms are positioned at two sides of the bottom wall of the first chamber, separately; a resistance capacitance snubber circuit board is disposed between the two support platforms, and is electrically connected to the laminated busbar.

13. The motor controller of claim 11, wherein a common mode filter is sleeved on the second terminals, and the second terminals pass through the common mode filter.

14. The motor controller of claim 11, wherein the box body is provided with a low-voltage signal connector which is electrically connected to the control circuit board.

15. The motor controller of claim 14, wherein a water supply connector and a water outlet connector are disposed on a side of the box body; the water supply connector is connected to the water inlet of the cooing waterway, and the water outlet connector is connected to the water outlet of the cooling waterway.

16. The motor controller of claim 11, wherein the control circuit board is electrically connected to a drive circuit board via board to board connectors; the sensor circuit board is electrically connected to the control circuit board via bunched wires.

17. The motor controller of claim 10, wherein the support platforms are two in number; the two support platforms are positioned at two sides of the bottom wall of the first chamber, separately; a resistance capacitance snubber circuit board is disposed between the two support platforms, and is electrically connected to the laminated busbar.

18. The motor controller of claim 10, wherein the box body is provided with a low-voltage signal connector which is electrically connected to the control circuit board.

19. The motor controller of claim 18, wherein a water supply connector and a water outlet connector are disposed on a side of the box body; the water supply connector is connected to the water inlet of the cooing waterway, and the water outlet connector is connected to the water outlet of the cooling waterway.

20. The motor controller of claim 10, wherein the control circuit board is electrically connected to a drive circuit board via board to board connectors; the sensor circuit board is electrically connected to the control circuit board via bunched wires.

21. A motor controller, comprising:
a) a box body comprising a chamber;

b) a capacitor module;
c) an inverter module; and
d) a radiator comprising an upper surface, a lower surface, a cooling waterway, a water inlet, and a water outlet;

wherein:

the radiator is disposed in the chamber and divides the chamber to yield a first chamber and a second chamber;

the inverter module is disposed on the upper surface of the radiator and in the first chamber;

the capacitor module is disposed on the lower surface of the radiator and in the second chamber;

the water inlet and the water outlet communicate with the cooling waterway;

the cooling waterway is adapted to cool the capacitor module and the inverter module;

the inverter module comprises an insulated gate bipolar transistor (IGBT) module, a drive circuit board, and a control circuit board;

the drive circuit board and the control circuit board are disposed on an upper surface of the IGBT module in sequence;

a needle bed stretches downwards from a bottom of the IGBT module;

the upper surface of the radiator is provided with grooves;

the needle bed on the IGBT module stretches into the grooves on the upper surface of the radiator;

the inverter module outputs a three-phase alternating current via a group of AC copper bars;

the group of AC copper bars is clung to a bottom wall of the first chamber;

a passageway is disposed on the radiator beneath the group of AC copper bars;

the passageway is connected to the grooves to form the cooling waterway;

the grooves communicate with the water inlet and the passageway communicates with the water outlet; and the box body is provided with a low-voltage signal connector which is electrically connected to the control circuit board.

22. The motor controller of claim 21, wherein a water supply connector and a water outlet connector are disposed on a side of the box body; the water supply connector is connected to the water inlet of the cooing waterway, and the water outlet connector is connected to the water outlet of the cooling waterway.

* * * * *